United States Patent
Taniguchi

(10) Patent No.: US 8,064,219 B2
(45) Date of Patent: Nov. 22, 2011

(54) CERAMIC SUBSTRATE PART AND ELECTRONIC PART COMPRISING IT

(75) Inventor: Fumitake Taniguchi, Tottori (JP)

(73) Assignee: Hitachi Metals, Ltd., Tokyo (JP)

( * ) Notice: Subject to any disclaimer, the term of this patent is extended or adjusted under 35 U.S.C. 154(b) by 414 days.

(21) Appl. No.: 12/442,616

(22) PCT Filed: Sep. 26, 2007

(86) PCT No.: PCT/JP2007/068717
§ 371 (c)(1),
(2), (4) Date: Mar. 24, 2009

(87) PCT Pub. No.: WO2008/038681
PCT Pub. Date: Apr. 3, 2008

(65) Prior Publication Data
US 2010/0302748 A1    Dec. 2, 2010

(30) Foreign Application Priority Data
Sep. 26, 2006 (JP) .................. 2006-260268

(51) Int. Cl.
*H01R 9/00* (2006.01)

(52) U.S. Cl. ........ 361/772; 174/250; 174/255; 174/257; 174/262; 427/123; 427/165; 427/537; 428/209; 428/447; 428/607; 428/680; 428/704; 438/63; 438/99; 438/149; 438/667; 438/678; 257/66; 257/106; 257/712; 257/737; 257/778

(58) Field of Classification Search .................. 361/772; 174/250, 255, 257, 262; 427/123, 165, 537; 428/209, 447, 607, 680, 704; 438/63, 99, 438/149, 667, 678; 257/66, 106, 712, 737, 257/778; 205/67, 70, 163
See application file for complete search history.

(56) References Cited

U.S. PATENT DOCUMENTS

| 7,417,324 | B2 | 8/2008 | Obiya |
| 2001/0033020 | A1 | 10/2001 | Stierman et al. |
| 2003/0071319 | A1 | 4/2003 | Stierman et al. |
| 2005/0200015 | A1 | 9/2005 | Obiya |

FOREIGN PATENT DOCUMENTS

| JP | 07-169797 A | 7/1995 |
| JP | 2001-267357 A | 9/2001 |
| JP | 2004-055624 | 2/2004 |
| JP | 2005-072282 A | 3/2005 |
| JP | 2005-259915 A | 9/2005 |
| JP | 2006-196648 A | 7/2006 |

OTHER PUBLICATIONS

Extended European Search Report corresponding to European Patent Application No. 07 828 463.5 dated Mar. 26, 2010.

*Primary Examiner* — Xiaoliang Chen
(74) *Attorney, Agent, or Firm* — Sughrue Mion, PLLC

(57) ABSTRACT

A ceramic substrate part comprising on its upper surface pluralities of external electrodes comprising wire-bonding electrodes, each of which comprises a primer layer based on Ag or Cu, a Ni-based lower layer, an intermediate layer based on a Pd—P alloy containing 0.4-5% by mass of P, and a Au-based upper layer formed in this order on a ceramic substrate, the upper layer containing Pd after heated by soldering, and having a Au concentration of 80 atomic % or more based on the total concentration (100 atomic %) of Au and Pd.

6 Claims, 3 Drawing Sheets

CERAMIC SUBSTRATE PART AND ELECTRONIC PART COMPRISING IT

CROSS REFERENCE TO RELATED APPLICATIONS

This application is a National Stage of International Application No. PCT/JP2007/068717 filed Sep. 26, 2007, claiming priority based on Japanese Patent Application No. 2006-260268, filed Sep. 26, 2006, the contents of all of which are incorporated herein by reference in their entirety.

FIELD OF THE INVENTION

The present invention relates to a ceramic substrate part having excellent wire bondability, and an electronic part comprising such a ceramic substrate part to which semiconductor devices are wire-bonded.

BACKGROUND OF THE INVENTION

When semiconductor devices are mounted on a dielectric or magnetic ceramic substrate, soldering is conducted by coating the substrate with a Sn-based solder, mounting the semiconductor devices on the solder, and heating the solder. As semiconductor devices are mounted on a ceramic substrate part at higher density, wire bonding has become used for electric connection between the ceramic substrate part and the semiconductor devices. In high-density wire bonding, gold wires as thick as 100 μm or less are connected to the wire-bonding electrodes of a heated ceramic substrate part with ultrasonic vibration.

The wire-bonding electrode generally comprises a primer layer of silver, copper, etc., a nickel plating layer, a substituted gold plating layer, and a reduced gold plating layer formed in this order on a ceramic substrate. In such terminal structure, the nickel plating layer acts as a barrier layer for protecting the primer layer from a solder. The gold plating layer provides improved connectability with gold wires. Reduction gold plating makes it possible to form a gold layer having any thickness, but because its plating solution is vulnerable to Ni, the substituted gold plating layer should be formed below the reduced gold plating layer.

However, part of the Ni plating layer corroded by substitution gold plating remains as pinholes after reduction gold plating. Accordingly, when the substrate is heated, nickel hydroxide generated by water intruding through the pinholes is exposed to the gold surface, extremely lowering wire bondability. To close the pinholes, an expensive reduced gold plating layer should be formed to a thickness of 0.2-0.7 μm, suffering high cost. In addition, even a thick reduced gold plating layer may not be able to bury the pinholes, resulting in bonding strength deteriorated by heat treatment.

Proposed to solve such problems is a method of forming only a substituted gold plating layer as thick as 0.1 μm or less, and removing nickel hydroxide from a gold layer surface by a plasma treatment before wire bonding. However, the substituted gold plating layer has many pinholes, and nickel much diffused to the gold surface during heat treatment cannot easily be removed by a plasma treatment, resulting in poor bonding reliability. Therefore, this method cannot be used for electronic parts needing high reliability.

JP 2004-55624 A discloses the formation of a Pd layer between a Ni layer and a Au layer to prevent the diffusion of Ni. However, Pd is thermally diffused to the Au layer while soldering devices such as inductors, etc. to mounting electrodes before the wire bonding of semiconductor devices, so that the wire bondability of the Au layer is deteriorated. This is because the existence of other metals than gold deteriorates the strength of bonding between gold wires and a gold plating layer, which is achieved by mutual diffusion with ultrasonic vibration. As lead-free, high-melting-point solders are widely used recently, the diffusion of Pd to a Au layer during soldering has become a serious problem.

OBJECT OF THE INVENTION

Accordingly, an object of the present invention is to provide a ceramic substrate part having electrodes with the corrosion of a lower Ni plating layer prevented and the diffusion of Pd to an uppermost Au layer suppressed, thereby having excellent wire bondability, and an electronic part comprising such a ceramic substrate part.

DISCLOSURE OF THE INVENTION

The ceramic substrate part of the present invention comprises on its upper surface pluralities of external electrodes comprising wire-bonding electrodes, each of which comprises a primer layer based on Ag or Cu, a Ni-based lower layer, an intermediate layer based on a Pd—P alloy containing 0.4-5% by mass of P, and a Au-based upper layer formed in this order on a ceramic substrate, the upper layer containing Pd after heated by soldering, and having a Au concentration of 80 atomic % or more based on the total concentration (100 atomic %) of Au and Pd.

It is preferable that the intermediate layer has a P content of 1.2-4% by mass, and that the upper layer has a Au concentration of 85 atomic % or more.

The intermediate layer preferably has a thickness of 0.05-0.2 μm. The upper layer preferably has a thickness of 0.03-0.2 μm.

The electronic part of the present invention comprises the above ceramic substrate part, and semiconductor devices mounted on the ceramic substrate part, the semiconductor devices being connected to the wire-bonding electrodes with gold wires.

DESCRIPTION OF THE PREFERRED EMBODIMENTS

Figure 1:
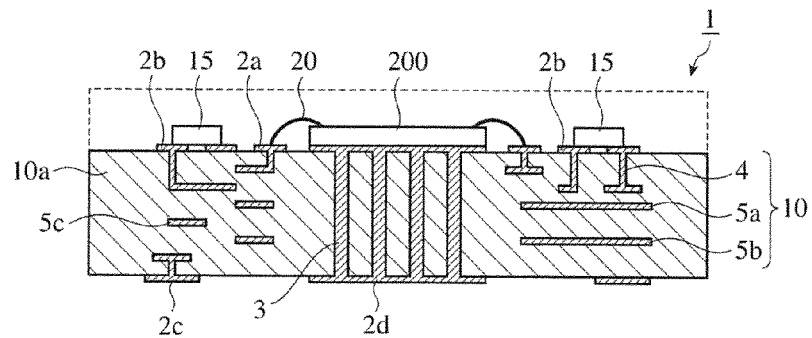
FIG. 1 is a vertical cross-sectional view showing an electronic part comprising a ceramic substrate part according to one embodiment of the present invention.

FIG. 1 shows the electronic part 1 of the present invention comprising a ceramic substrate part 10, and an amplifier as one example of semiconductor devices 200. The ceramic substrate part 10 contains internal electrodes such as capacitor electrodes 5a, inductor electrodes 5c and ground electrodes 5b. The ceramic substrate part 10 also has external electrodes, those formed on its upper surface being wire-bonding electrodes 2a connected to the semiconductor device 200 with bonding wires 20, and mounting electrodes 2b on which devices such as inductors 15, etc. are mounted, and those formed on its lower surface being connecting electrodes 2c to be connected to a circuit board, a heat-dissipating electrode 2d, etc. These electrodes are connected to internal electrodes through thermal-vias 3 and via-electrodes 4. The upper surface of the ceramic substrate part 10 is sealed with a resin.

[1] Ceramic Substrate Part

The ceramic substrate part 10 is a ceramic laminate comprising internal and external electrodes, and each ceramic green sheet constituting the ceramic substrate part 10 is made of dielectric ceramics or magnetic ceramics such as soft ferrite, etc. The dielectric ceramics are, for instance, based on alumina, silica, etc. Each ceramic green sheet is screen-printed with a conductive paste based on Ag, Cu, etc. to form a primer layer 40 each constituting an external electrode. The primer layer 40 constituting the external electrode may be formed on a ceramic green sheet constituting the uppermost or lowermost layer before lamination, or after a laminate containing internal electrodes is formed. For instance, when the primer layer 40 is formed on a ceramic green sheet in advance, pluralities of sheets printed with internal electrodes having different patterns, and two ceramic green sheets printed with primer layers 40 are laminated, pressure-bonded, and then sintered.

Figure 2:
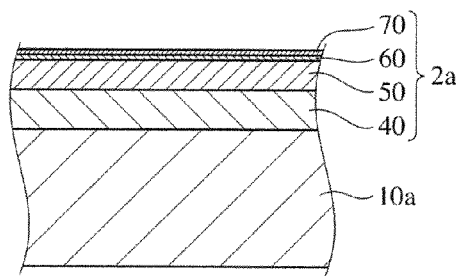
FIG. 2 is an enlarged cross-sectional view showing a wire-bonding electrode in the ceramic substrate part according to one embodiment of the present invention.

FIG. 2 shows the structure of an external electrode formed on the upper surface of the ceramic laminate. This structure need only be possessed by at least wire-bonding electrodes 2a, but when the wire-bonding electrodes 2a, the mounting electrodes 2b and the connecting electrodes 2c are produced simultaneously by immersing the ceramic laminate in a plating bath, all of these electrodes have the structure shown in FIG. 2.

A case where wire-bonding electrodes 2a having the structure shown in FIG. 2 are formed as external electrodes will be explained below. A primer layer 40 based on Ag, Cu, etc. and having a thickness of 2-30 µm is formed on an upper surface of the ceramic substrate 10a, and a Ni-based lower layer 50 is formed by a plating method on the primer layer 40. The plating may be either electroplating or electroless plating. When the electroless plating method is used, dimethylamine borane may be used as a reducing agent to form a Ni—B layer, or sodium hypophosphite may be used as a reducing agent to form a Ni—P layer. The Ni-based lower layer 50 preferably has a thickness of 1-15 µm. When the thickness of the lower layer 50 is less than 1 µm, it is impossible to prevent a solder from diffusing to the primer layer 40 during soldering. When the thickness of the lower layer 50 is more than 15 µm, external electrode 2a may be cracked due to internal stress, resulting in lower adhesion. The more preferred thickness of the lower layer 50 is 2-7 µm.

An intermediate layer 60 based on a Pd—P alloy is formed on the Ni-based lower layer 50 by an electroless plating method. The intermediate layer 60 contains 0.4-5% by mass of P. Because P is less mobile by heat, P coprecipitated with Pd prevents Pd from diffusing to a Au layer. When the P content is less than 0.4% by mass, there is no enough effect of preventing the thermal diffusion of Pd to the Au layer, resulting in low bonding strength after heat treatment. The P content is preferably 1% by mass or more, because the thermal diffusion of Pd can be sufficiently reduced even at as high temperatures as 300° C. or higher. When the P content is more than 5% by mass, the Pd—P plating layer is hard and brittle, resulting in low bonding strength.

The intermediate Pd—P plating layer 60 is preferably dense, more preferably amorphous. When the intermediate layer 60 is crystalline, grain boundaries tend to have pinholes, through which nickel hydroxide contaminates a Au surface. When the intermediate layer 60 has a dense or amorphous structure, it has fewer pinholes.

The thickness of the intermediate Pd—P plating layer 60 is preferably 0.05-0.2 µm. When the thickness is less than 0.05 µm, the corrosion of Ni cannot be prevented when plating Au, resulting in low bonding strength. When the thickness of the intermediate layer 60 exceeds 0.2 µm, a large amount of a Sn—Pd alloy is formed during soldering, resulting in low soldering strength and economic disadvantage.

The structure of the intermediate Pd—P plating layer 60 and the P content therein can be controlled by adjusting the amount of a phosphorus compound added to a plating solution. The adjustment of the amount of a phosphorus compound such as sodium hypophosphite and sodium phosphite added as a reducing agent and a crystallization-controlling agent to the plating solution provides the Pd—P plating with the desired P content. With 1% by mass or more of P, the Pd—P plating layer can be made amorphous.

A Au-based upper layer 70 is formed on the intermediate layer 60. The intermediate Pd—P alloy layer 60 between the Ni-based lower layer 50 and the Au-based upper layer 70 prevents the lower layer 50 from being corroded by substitution gold plating, thereby suppressing the generation of pinholes. Because the Pd—P alloy plating is formed on the Ni-based lower layer 50 by a reduction method, the lower layer 50 does not corrode. Because of few pinholes due to corrosion, contamination with nickel hydroxide does not occur even when the upper gold layer 70 is thin.

The upper gold layer 70 is formed on the intermediate layer 60 by an electroless plating method. An electroless plating solution may be a cyanide type or a cyanide-free type. The thickness of the upper layer 70 is preferably 0.03-0.2 µm. When the upper layer is less than 0.03 µm, it does not well bond to gold wires, resulting in insufficient bonding strength. When the upper layer is less than 0.03 µm, Au does not well diffuse to a solder during soldering, failing to obtain good solder wettability. On the other hand, when the thickness exceeds 0.2 µm, too much gold is spent, resulting in unnecessary production cost increase.

Gold plating for the upper layer 70 is preferably conducted by one step using a weak-reducing plating solution. Although gold plating conventionally uses only a substitution plating solution or a substitution plating solution and a reduction plating solution successively, (1) the use of only substitution plating cannot easily provide a gold plating layer of 0.05 µm or more in thickness, and the gold plating layer formed has many pinholes, and (2) a combination of substitution plating and reduction gold plating is disadvantageous in cost because of a large number of plating steps.

The weak-reducing gold plating solution can be prepared by adding a weak-reducing material such as hydrazine and formic acid to a gold plating solution based on sodium gold sulfite or sodium gold cyanide and containing a complexing agent, a stabilizing agent, etc.

The ceramic substrate part 10 provided with wire-bonding electrodes 2a comprising three plating layers 50, 60, 70 formed on the primer layer 40 of Ag, Cu, etc. is subjected to solder reflowing for mounting devices such as capacitors, inductors, etc. before wire bonding. Specifically, after the mounting electrodes 2b of the ceramic substrate part 10 are coated with a Sn-based solder paste, capacitance elements, resistance elements, etc. are mounted on the electrodes 2b, and the ceramic substrate part 10 is heated to melt the solder paste, such that the mounted devices are fixed. Accordingly, the wire-bonding electrodes 2a are exposed to a reflowing temperature (heated) before wire bonding. The reflowing temperature is usually 230-400° C., though changeable depending on the melting point of a solder. Therefore, the heating temperature of the wire-bonding electrodes 2a is also 230-400° C. When it is lower than 230° C., the solder is not sufficiently melted, making it likely to provide insufficient connection. On the other hand, when the wire-bonding electrodes 2a are heated to higher than 400° C., troubles such as erosion by soldering, etc. are likely to occur. The preferred reflowing temperature is 250-350° C.

Because the wire-bonding electrodes 2a are heated during solder reflowing, Pd is diffused from the intermediate layer 60 to the upper gold layer 70, so that the upper layer 70 is turned to a Au—Pd alloy. Because the amount of Pd diffused differs depending on the heating temperature, the ceramic substrate part 10 is preferably uniformly heated using a reflow furnace, etc. Because the diffusion of Pd is suppressed by P in the intermediate layer 60, the concentration of Au in the upper layer 70 is 80 atomic % or more based on the total concentration (100 atomic %) of Au and Pd. The Au concentration of less than 80 atomic % provides low bonding strength, resulting in extremely low bonding reliability.

[2] Electronic Part

The wire-bonding electrodes 2a of the ceramic substrate part 10 are connected to the terminals of the semiconductor device 200 with bonding wires 20. From the aspect of reliability and mounting density, the bonding wires 20 are preferably gold wires as thick as 100 μm or less. The resultant electronic parts may be amplifiers, voltage-controlled oscillators, high-frequency switches, DC-DC converters, etc.

The present invention will be explained in further detail by Examples below without intention of restricting the present invention thereto.

Examples 1-5

Each alumina-based ceramic green sheet was screen-printed with a conductive silver-based paste to form internal electrodes. Pluralities of ceramic green sheets having internal electrodes with different patterns were laminated and pressure-bonded to a laminate. An upper surface of the laminate was printed with a silver-based paste to form a 10-μm-thick primer layer. This laminate was sintered at 900° C. for 1 hour.

The laminate was washed with sulfuric acid and then immersed in an aqueous palladium-chloride-based solution to attach palladium chloride to the primer layer. After excess palladium chloride was washed away with ion-exchanged water, the laminate was immersed in a heated electroless Ni—P plating solution containing sodium hypophosphite as a reducing agent to form a Ni—P layer. After the Ni—P layer was washed with ion-exchanged water, the laminate was immersed in a sodium-hypophosphite-containing, electroless palladium plating solution, whose composition was adjusted to form a Pd—P alloy layer containing 1.2-4% by mass of P on the Ni—P layer. After washed with ion-exchanged water, the laminate was immersed in a heated, cyanide-free, substitution gold plating solution to form a Au layer on the Pd—P alloy layer. The thickness of each plating layer was adjusted by the plating solution immersion time.

Figure 5:
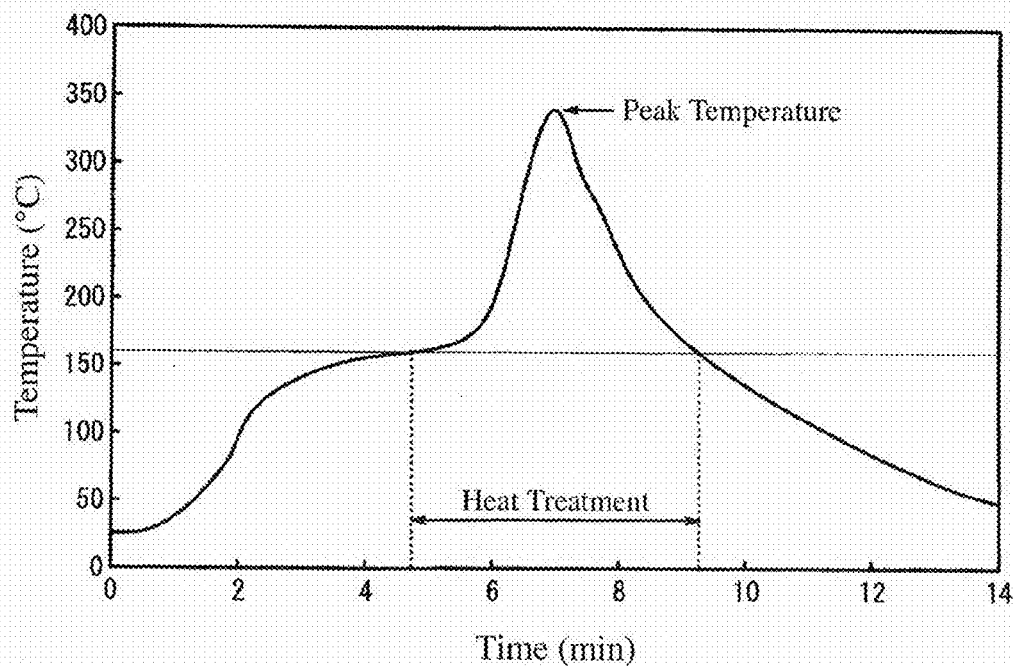
FIG. 5 is a graph showing the heat treatment conditions of the ceramic substrate part according to one embodiment of the present invention.

The resultant ceramic substrate part was coated with a Sn—Ag—Cu-based solder paste on one of its mounting electrodes, and passed through a reflow furnace set at a peak temperature of 340° C., with a semiconductor chip mounted on the electrode, so that the solder was heat-treated to make the semiconductor chip connected to the mounting electrode of the ceramic substrate part. FIG. 5 shows heat treatment conditions. In these Examples, each ceramic substrate part was preheated to 160° C., and heated to the peak temperature in about 90 seconds. Thereafter, a pad of the semiconductor chip was bonded to the wire-bonding electrode of the ceramic substrate part with a 25-μm-thick gold wire using an ultrasonic bonder.

With respect to each of the resultant ceramic substrate parts, the following evaluations were conducted.

(1) Thickness of Each Plating Layer

The thickness of each plating layer was measured by an X-ray fluorescence thickness meter.

(2) P Content in Pd—P Alloy Layer (Intermediate Layer)

Measured by glow discharge optical emission spectroscopy.

(3) Connecting Strength and Breakage Mode of Bonded Wire

Each bonded wire was pulled by a jig until it was broken to measure the bonding strength of the wire. The breakage modes of the wire are as follows.

Wire cut: The wire was cut.
Detached: The wire was detached from the pad of the semiconductor device.

(4) Concentration of Au in Upper Layer

To examine how much Pd is diffused from the intermediate layer to the upper layer by heat treatment, auger electron spectroscopy (AES) was conducted from the upper layer surface to the intermediate layer. The concentration of Au is expressed by atomic % based on the total concentration (100 atomic %) of Au and Pd.

(5) Surface Structure of Intermediate Layer

Before forming the upper layer, a surface of the intermediate layer was observed by a scanning electron microscope.

Comparative Examples 1 and 2

After forming the lower Ni—P layer, ceramic substrate parts having external electrodes were produced in the same manner as in Example 1, except that an intermediate plating layer of pure palladium was formed by a palladium plating solution containing formic acid as a reducing agent, and that a Au layer was formed on the intermediate layer by a heated, cyanide-free, substitution gold plating solution. Heat treatment and wire bonding were conducted on each ceramic substrate part in the same manner as in Example 1, and the same evaluations as in Example 1 were conducted. The results are shown in Table 1.

TABLE 1

| No. | Thickness of Plating Layer (μm) | | | P Content in Intermediate Layer (% by mass) |
|---|---|---|---|---|
| | Lower Layer | Intermediate Layer | Upper Layer | |
| Example 1 | 5.5 | 0.12 | 0.11 | 1.2 |
| Example 2 | 5.4 | 0.11 | 0.10 | 2.1 |
| Example 3 | 5.6 | 0.13 | 0.11 | 3.8 |
| Example 4 | 6.0 | 0.10 | 0.07 | 4.0 |

TABLE 1-continued

| No. | | | |
|---|---|---|---|
| Example 5 | 5.8 | 0.09 | 0.04 | 3.9 |
| Comparative Example 1 | 5.9 | 0.14 | 0.02 | 3.6 |
| Comparative Example 2 | 5.5 | 0.11 | 0.12 | 0.0 |

| No. | Bonding Strength of Wire (N) | Breakage Mode | Au Content in Upper Layer (atomic %) |
|---|---|---|---|
| Example 1 | 0.116 | Wire Cut | 85 |
| Example 2 | 0.117 | Wire Cut | 89 |
| Example 3 | 0.115 | Wire Cut | 96 |
| Example 4 | 0.117 | Wire Cut | 92 |
| Example 5 | 0.118 | Wire Cut | 89 |
| Comparative Example 1 | 0.067 | Detached | 81 |
| Comparative Example 2 | 0.067 | Detached | 71 |

Figure 3:
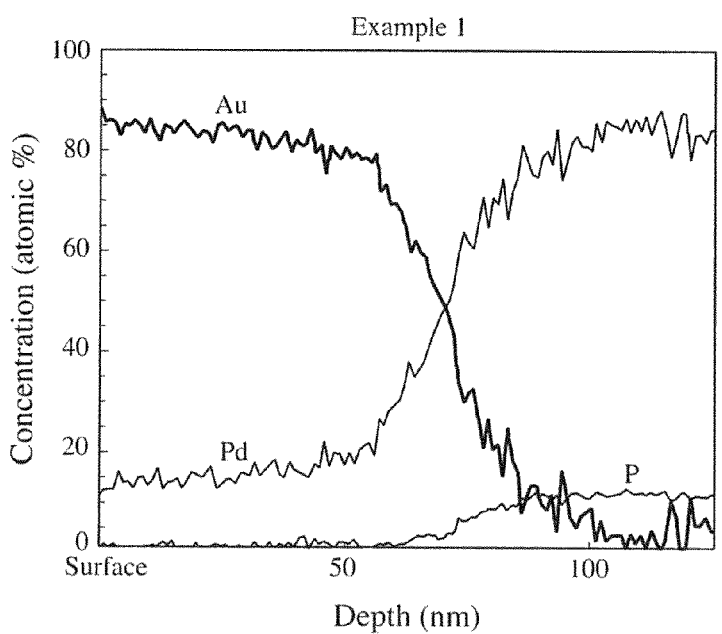
FIG. 3 is a graph showing the relative concentration distribution of elements in a thickness direction in a wire-bonding electrode in the ceramic substrate part according to one embodiment of the present invention.
Figure 6:
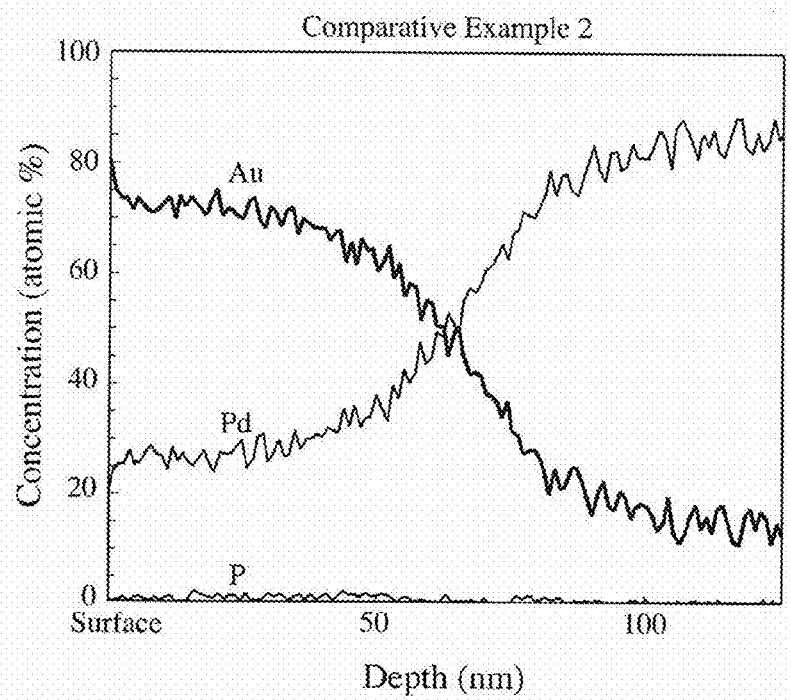
FIG. 6 is a graph showing the relative concentration distribution of elements in a thickness direction in a wire-bonding electrode in a conventional ceramic substrate part.

FIGS. 3 and 6 respectively show the distribution of elements in the wire-bonding electrodes of the ceramic substrate parts of Example 1 and Comparative Example 2 measured in a depth direction by auger electron spectroscopy. The diffusion of Pd to the upper layer was suppressed in Example 1 containing P in the intermediate layer than in Comparative Example 2 not containing P in the intermediate layer. The gold content in the upper layer up to depth of 10 nm was increased by the suppression of diffusion of Pd due to the inclusion of P. On the other hand, in Comparative Example 2 having a low gold content because of much diffusion of Pd, the gold wire was detached from the wire-bonding electrode. In Comparative Example 1 having a thin upper layer, the gold wire was not well bonded to the upper layer, detaching from the wire-bonding electrode.

Figure 4:
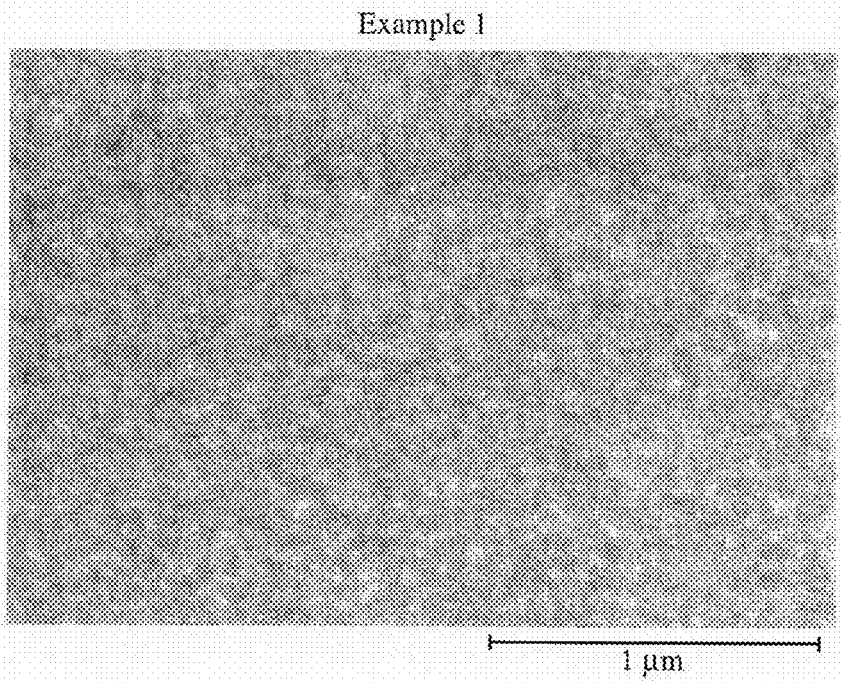
FIG. 4 is an electron photomicrograph showing the surface structure of an intermediate layer in the ceramic substrate part according to one embodiment of the present invention.
Figure 7:
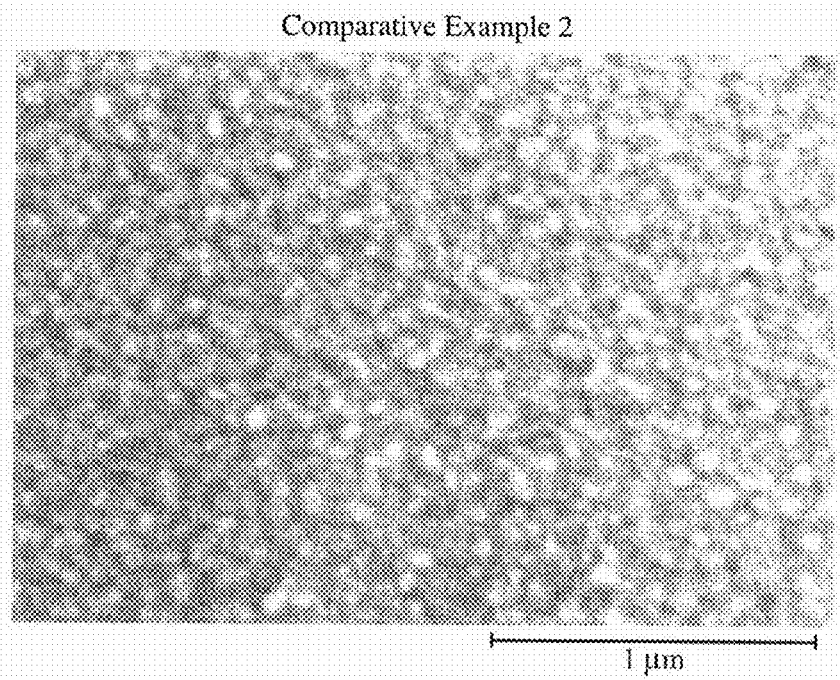
FIG. 7 is an electron photomicrograph showing the surface structure of an intermediate layer in the conventional ceramic substrate part.

FIGS. 4 and 7 respectively show the surface structures of the intermediate layers of Example 1 and Comparative Example 2. While crystals were observed in the intermediate layer of Comparative Example 2 as shown in FIG. 7, crystals and pinholes were not observed in the intermediate P-containing Pd plating layer of Example 1 as shown in FIG. 4. X-ray diffraction revealed that the intermediate layer of Example 1 was amorphous.

Examples 6-10, and Comparative Examples 3-5

Ceramic substrate parts containing different amounts of P in intermediate layers were produced in the same manner as in Example 1. One of the mounting electrodes in each ceramic substrate part was coated with a Sn—Ag—Cu-based solder paste, and a semiconductor device was mounted on the electrode. Each ceramic substrate part passed through a reflow furnace set at a peak temperature of 230° C., 250° C., 300° C. or 340° C., to connect the semiconductor device to the ceramic substrate part by soldering, and to conduct a heat treatment. The temperature elevation conditions in the reflow furnace were the same as in Example 1. The same evaluations as in Example 1 were conducted. The results are shown in Table 2.

TABLE 2

| No. | Thickness of Plating Layer (μm) | | | P Content in Intermediate Layer (% by mass) |
|---|---|---|---|---|
| | Lower Layer | Intermediate Layer | Upper Layer | |
| Example 6 | 5.4 | 0.11 | 0.11 | 1.9 |
| Example 7 | 5.4 | 0.11 | 0.11 | 1.9 |
| Example 8 | 5.4 | 0.11 | 0.11 | 1.9 |
| Example 9 | 5.4 | 0.11 | 0.11 | 1.9 |
| Example 10 | 5.5 | 0.10 | 0.12 | 0.4 |
| Comparative Example 3 | 5.5 | 0.10 | 0.12 | 0.4 |
| Comparative Example 4 | 5.5 | 0.10 | 0.12 | 0.4 |
| Comparative Example 5 | 5.5 | 0.10 | 0.12 | 0.4 |

| No. | Heat Treatment Temperature (° C.) | Bonding Strength of Wire (N) | Breakage Mode | Au Content in Upper Layer (atomic %) |
|---|---|---|---|---|
| Example 6 | 230 | 0.119 | Wire Cut | 94.5 |
| Example 7 | 250 | 0.117 | Wire Cut | 92.5 |
| Example 8 | 300 | 0.117 | Wire Cut | 89.6 |
| Example 9 | 340 | 0.114 | Wire Cut | 88.0 |
| Example 10 | 230 | 0.110 | Wire Cut | 82.2 |
| Comparative Example 3 | 250 | 0.094 | Detached | 78.2 |
| Comparative Example 4 | 300 | 0.055 | Detached | 76.5 |
| Comparative Example 5 | 340 | 0.040 | Detached | 74.5 |

When the intermediate layer contained 1.9% by mass of P, good wire bondability was obtained even with a high-temperature heat treatment. When the intermediate layer contained 0.4% by mass of P, wire bondability was decreased by a high-temperature heat treatment, but good wire bondability was obtained by a low-temperature heat treatment as long as the gold content in the upper layer was 80 atomic % or more.

EFFECT OF THE INVENTION

The formation of an intermediate layer based on a Pd—P alloy containing P between a Ni-based lower layer and a Au-based upper layer according to the present invention provides ceramic substrate parts with excellent bondability and solder wettability.

What is claimed is:

1. A ceramic substrate part comprising on its upper surface pluralities of external electrodes comprising wire-bonding electrodes, each of which comprises a primer layer based on Ag or Cu, a Ni-based lower layer, an intermediate layer based on a Pd—P alloy containing 0.4-5% by mass of P, and a Au-based upper layer formed in this order on a ceramic substrate, said upper layer containing Pd after heated by soldering, and having a Au concentration of 80 atomic % or more based on the total concentration (100 atomic %) of Au and Pd.

2. The ceramic substrate part according to claim 1, wherein said intermediate layer has a P content of 1.2-4% by mass, and said upper layer has a Au concentration of 85 atomic % or more.

3. The ceramic substrate part according to claim 1, wherein said intermediate layer has a thickness of 0.05-0.2 μm.

4. The ceramic substrate part according to claim 1, wherein said upper layer has a thickness of 0.03-0.2 μm.

5. The ceramic substrate part according to claim 1, wherein part of said external electrodes are mounting electrodes, to which devices are connected by soldering.

6. An electronic part comprising the ceramic substrate part recited in claim 1, and semiconductor devices mounted on said ceramic substrate part, said semiconductor devices being connected to said wire-bonding electrodes with gold wires.

* * * * *